(12) United States Patent
McNally et al.

(10) Patent No.: US 12,719,034 B2
(45) Date of Patent: Aug. 25, 2026

(54) NON-INVASIVE MEASUREMENT OF PLASMA SYSTEMS

(71) Applicant: DUBLIN CITY UNIVERSITY, Dublin (IE)

(72) Inventors: Patrick McNally, County Dublin (IE); David Coates, Dublin (IE); Niall MacGearailt, County Dublin (IE); Seán Kelly, Dublin (IE); Rajani K. Vijayaraghavan, County Dublin (IE)

(73) Assignee: DUBLIN CITY UNIVERSITY (IE)

( * ) Notice: Subject to any disclaimer, the term of this patent is extended or adjusted under 35 U.S.C. 154(b) by 297 days.

(21) Appl. No.: 18/030,122

(22) PCT Filed: Oct. 11, 2021

(86) PCT No.: PCT/EP2021/078080
§ 371 (c)(1),
(2) Date: Apr. 4, 2023

(87) PCT Pub. No.: WO2022/074262
PCT Pub. Date: Apr. 14, 2022

(65) Prior Publication Data
US 2023/0335382 A1 Oct. 19, 2023

(30) Foreign Application Priority Data
Oct. 9, 2020 (GB) ..................................... 2016105

(51) Int. Cl.
*H01J 37/32* (2006.01)

(52) U.S. Cl.
CPC .. *H01J 37/32972* (2013.01); *H01J 37/32091* (2013.01); *H01J 37/32119* (2013.01); *H01J 37/32926* (2013.01); *H01J 37/3299* (2013.01)

(58) Field of Classification Search
None
See application file for complete search history.

(56) References Cited

U.S. PATENT DOCUMENTS 6,830,650 B2 * 12/2004 Roche ............... H01J 37/32935 118/712
7,006,205 B2 * 2/2006 Agarwal ........... H01J 37/32935 356/326

(Continued)

FOREIGN PATENT DOCUMENTS

EP 3602602 B1 * 1/2021 ........ H01J 37/32972
WO WO-2004006285 A1 * 1/2004 ........ H01J 37/32963

(Continued)

OTHER PUBLICATIONS

Mandelis, Andreas; "Review of Scientific Instruments New Products"; Review of Scientific Instruments; vol. 90; (2019); pp. 079501-1-079501-5.

(Continued)

*Primary Examiner* — Srinivas Sathiraju
(74) *Attorney, Agent, or Firm* — K&L GATES LLP

(57) ABSTRACT

The invention provides a system and method for measuring a characteristic of a plasma or a plasma chamber, wherein the plasma chamber has a viewport or a surface which is permeable to electromagnetic radiation such that at least a portion of the electromagnetic radiation emitted by the plasma in the plasma chamber passes through the viewport, the method comprising providing the antenna of a Radio Emission Spectroscopy, RES, plasma bulk system externally to the plasma chamber to absorb at least a portion of the electromagnetic radiation that has passed through the viewport and configured to measure signals in the near-field E- and B-field regions; measuring a first value based on the signal induced in the antenna wherein the signal is obtained from a plurality of powered RF electrodes configured to be independently modulated with one or more power sources; and calculating a second value indicative of a change of magnitude of the characteristic based on a change of mag- (Continued)

nitude of the first value, wherein the characteristic is plasma power and/or plasma pressure.

18 Claims, 7 Drawing Sheets

(56) References Cited

U.S. PATENT DOCUMENTS

| | | | | |
|---|---|---|---|---|
| 7,192,505 | B2 * | 3/2007 | Roche | H01J 37/32935 118/712 |
| 7,750,646 | B2 * | 7/2010 | Maity | H02H 1/0023 702/57 |
| 9,406,485 | B1 * | 8/2016 | Cheng | H01J 37/32091 |
| 9,842,726 | B2 * | 12/2017 | Daniels | H01J 37/32972 |
| 10,032,609 | B1 * | 7/2018 | Cheng | C23C 16/513 |
| 11,476,098 | B2 * | 10/2022 | McNally | H01J 37/32963 |
| 2003/0223055 | A1 * | 12/2003 | Agarwal | G01N 21/73 356/72 |
| 2004/0007326 | A1 * | 1/2004 | Roche | H01J 37/32935 118/712 |
| 2005/0011611 | A1 * | 1/2005 | Mahoney | H01J 37/32935 156/345.24 |
| 2005/0034812 | A1 * | 2/2005 | Roche | H01J 37/32935 156/345.28 |
| 2005/0039852 | A1 * | 2/2005 | Roche | H01J 37/32935 156/345.24 |
| 2007/0227667 | A1 * | 10/2007 | Yamazawa | H01L 21/67069 156/345.48 |
| 2008/0035170 | A1 * | 2/2008 | Baek | B08B 7/0035 134/107 |
| 2011/0056272 | A1 * | 3/2011 | McNally | H01J 37/32935 73/24.02 |
| 2016/0268108 | A1 * | 9/2016 | Daniels | H01J 37/32935 |
| 2021/0104387 | A1 * | 4/2021 | McNally | H01J 37/32972 |
| 2023/0335382 | A1 * | 10/2023 | McNally | H01J 37/3299 |
| 2023/0352281 | A1 * | 11/2023 | Di Liberto | H01J 37/32926 |

FOREIGN PATENT DOCUMENTS

| | | | | |
|---|---|---|---|---|
| WO | WO-2011022294 | A1 * | 2/2011 | H01J 37/32082 |
| WO | WO-2018177965 | A1 * | 10/2018 | H01J 37/32963 |
| WO | WO-2020161003 | A1 * | 8/2020 | G01N 35/02 |
| WO | WO-2022074262 | A1 * | 4/2022 | H01J 37/32917 |

OTHER PUBLICATIONS

PCT International Search Report and PCT Written Opinion for PCT International Patent Application No. PCT/EP2021/078080; mailing date Jan. 28, 2022; (12 pages).

* cited by examiner

NON-INVASIVE MEASUREMENT OF PLASMA SYSTEMS

CROSS REFERENCE TO RELATED APPLICATIONS

This is the national phase under 35 U.S.C. § 371 of International Application No. PCT/EP2021/078080 filed on Oct. 11, 2021, which claims priority to and the benefit of United Kingdom Application No. 2016105.5 filed on Oct. 9, 2020, the entire disclosures of each of which are incorporated by reference herein.

FIELD

The present disclosure is directed towards systems and methods for the measurement of one or more plasma systems. In particular, the present disclosure is directed towards the non-invasive and in situ monitoring of plasma.

BACKGROUND

Plasmas are extremely common and are used in many industrial processing settings. For example, low pressure systems are used for advanced materials processing, including for materials deposition and etch in e.g. the semiconductor or medical industry sectors. Atmospheric pressure plasma processing systems also have industrial applications, e.g. materials cleaning, bonding, deposition, etch for the aeronautical and auto industry sectors. In typical use, a plasma is provided within a plasma chamber. A plasma chamber (which is also called a process chamber) is a sealed chamber within which a plasma is used to operate upon a given surface, such as e.g. a substrate of a microchip during the fabrication of the microchip. In use, the plasma chamber may be a partial or full vacuum.

In order to utilise plasmas, plasma diagnosis and monitoring techniques are essential. These techniques are used for measuring a plasma's parameters, which in turn can then be used e.g. for optimizing equipment and/or controlling low pressure plasma processes in real-time, for example during semiconductor processing and device fabrication, as disclosed by 1. Yue H H, Qin S J, Markle R J, Nauert C and Gatto M 2000 Fault detection of plasma etchers using optical emission spectra IEEE Trans. Semicond. Manuf. 13 37; Gottscho R A and Miller T A 1984 Optical techniques in plasma diagnostics Pure & Appl. Chem. 56 189; Kim I J and Yun I 2018 Real-time plasma monitoring technique using incidentangle-dependent optical emission spectroscopy for computer-integrated manufacturing Robot Cim-Int Manuf; and Mangolini L 2017 Monitoring nonthermal plasma processes for nanoparticle synthesis J. Phys. D: Appl. Phys. 50 373003.

These techniques are particularly important because small variations in the plasma's parameters can add significant cost to fabrication. Thus, by properly monitoring changes in the plasma's parameters, it is possible to avoid process delays and/or to minimize quality variations in fabrication lines. This is particularly important for non-equilibrium plasma processes. Real time diagnosis and control of a plasma's parameters (and in turn e.g. controlling plasma induced chemistries) is therefore a key economic advantage for high volume semiconductor manufacturing industries, for example as disclosed by Dolins S B, Srivastava A and Flinchbaugh B E 1988 Monitoring and diagnosis of plasma etch processes, IEEE Trans. Semicond. Manuf. 1, 23 To date several plasma probes and diagnostic techniques and have been developed and incorporated into semiconductor fabrication lines to monitor plasma parameters. However, non-invasive and in situ monitoring of a plasma is essential for process control. Non-invasive plasma metrology is a particular prerequisite as many current probe systems perturb the plasma itself which alters, de facto, the actual measurement one is attempting to perform.

In order to avoid significant perturbations to the plasma, non-invasive probes are preferable, see publications by Hopkins M B and Lawler J F 2000 Plasma diagnostics in industry Plasma Phys. Control. Fusion 42 B189; Donnelly V M and Kornblit A 2013 Plasma etching: Yesterday, today, and tomorrow J. Vac. Sci. Technol. A 31 050825-1; and Bruggeman P J and Czarnetzki U 2016 Retrospective on 'The 2012 Plasma Roadmap' J. Phys. D: Appl. Phys. 49 431001. For example, optical sensors external to a plasma chamber can be used for optical emission spectroscopy (OES). OES is a well-established and widely used non-invasive monitoring technique in the semiconductor processing industry. In use, a viewport which is permissive to optical signals is provided in a wall of a plasma chamber. Optical signals generated by the plasma pass through the viewport and are detected outside the plasma chamber by one or more optical sensors, see Schmachtenberg E and Hegenbart A 2007 Monitoring of plasma processes by OES, 2007 WILEY-VCH Verlag GmbH & Co. KGaA, Weinheim.

However, OES has some significant drawbacks. For example, optical signals are considerably affected by clouding of the optical viewport in real life fabrication scenarios, see Milosavljević V, MacGearailt N, Cullen P J, Daniels S and Turner M M 2013 Phase-resolved optical emission spectroscopy for an electron cyclotron resonance etcher J. Appl. Phys 113 163302. This degradation in opacity occurs due to thin film deposition or due to surface etching on the viewport by plasmas, see Jang H, Nam J, Kim C-K and Chae H 2013 Real-Time Endpoint Detection of Small Exposed Area SiO2 Films in Plasma Etching Using Plasma Impedance Monitoring with Modified Principal Component Analysis Plasma Process. Polym. 10, 850. Hence the development of a non-invasive and contact-free (remote) monitoring probe for industrial plasmas, that can be retro fitted to existing plasma chambers, and which is not affected by the optical opacity of the viewport, would be a beneficial and important advancement in the field.

One alternative approach to OES is Radio Emission Spectroscopy (RES) as disclosed by Kelly S and McNally P J 2017 Remote sensing of a low pressure plasma in the radio near field Appl. Phys. Express 10 096101. RES employs a near field antenna (for example a B-field antenna, although E-field antennae can also be employed) to capture radio frequency emissions from the plasma in the vicinity of the viewport of a plasma chamber. RES has been established as viable technique to monitor the plasma current within a plasma chamber. Employing a near field antenna, magnetic flux (for the case of a B-field antenna) emanating from plasma currents running between the electrodes can be intercepted and sampled using a spectrum analyser setup. As used herein, radio frequency emissions are emissions of electromagnetic radiation within a typical range of 3 kHz to 3 GHz. For the E-field antenna variations in voltages in the combined bulk plasma and induced plasma sheaths near the chamber walls lead to the generation of currents in the antenna via capacitive coupling to the antenna.

PCT Patent publication number WO2004/006285, Tokyo Electron Limited, discloses general RF antennae both inside and outside the processing chamber housing a plasma, and is not particularly suited to discriminating to multiple signal sources that can be associated with a plasma chamber. Only precisely chosen antennae with the capability to distinguish between electric fields and magnetic fields, combined with efficacy in the near field region, which is not defined or disclosed in WO2004/006285, would possess the capability outlined in this application.

A paper publication by Mandelis, *Rev. Sci. Instrum.* 90, 079501 (2019)) discloses an instrument for non-invasive plasma chamber monitoring. However the proposal in this paper publication is not sensitive or accurate enough for monitoring the condition of a plasma where multiple signals are present. A close inspection of figure shown in Mandelis' publication for the "Antenna", clearly demonstrates that only two coaxial BNC type outputs are available. The use of BNC-only cabling limits the frequency range considerably, thereby rendering the analysis of heterodyne/intermixed products from multiple electrodes nearly impossible, if those mixing products appear outside the relatively narrow range implied by the use of BNC cabling, approximately 40 kHz-500 MHz, only.

PCT/EP2018/057556 describes a significant advance over the prior art through disclosing a Radio Emission Spectroscopy (RES) system. This system, in a preferable embodiment, involves the placement of an electric near field (E-field) antenna and/or magnetic near field (B-field) antenna externally and proximate to a plasma chamber. For the reasons set out above, the placement of the near field antenna outside the plasma chamber is highly beneficial. The near field antenna is connected to appropriate signal analysis systems in order to monitor the current or voltage of a plasma within a plasma chamber under operational conditions.

The present disclosure builds on the contribution provided by PCT/EP2018/057556 and the paper by S. Kelly and P. J. McNally, *Appl. Phys. Express* 10 (2017) 096101, which describes Radio Emission Spectroscopy (RES) system. In a typical embodiment, in order to measure and control plasma properties in a plasma process chamber, a RES system involves the placement of: a near field (NF) electric field (E-field) antenna; and/or a NF magnetic field (B-field) antenna in close proximity to (e.g. preferably 40 mm or less) to the interior of the plasma process chamber. Crucially, the antenna(s) are located externally to the plasma i.e. according to the present disclosures antenna(s) are not immersed and do not make physical contact with a plasma or its containment vessel in use.

The present disclosure is directed towards the use of RES to monitor a plasma's parameters (e.g. power, pressure, etc.) or a plasma chamber that requires sensitive and accurate measurements in a more efficient and accurate way compared to current prior art systems.

SUMMARY

The present invention is directed towards a method, system and computer-readable medium the features of which are set out in the appended claims. The present invention provides systems and methods to monitor one or more of pressure, pressure variations (preferably, thereby providing a means for leak detection), plasma chamber cleanliness and/or contamination in single or multi-frequency driven plasma system(s).

In one embodiment there is provided a method for measuring a characteristic of a plasma or a plasma chamber, wherein the plasma chamber has a viewport or a surface which is permeable to electromagnetic radiation such at least a portion of the electromagnetic radiation emitted by the plasma in the plasma chamber passes through the viewport, the method comprising:

- providing the antenna of a Radio Emission Spectroscopy, RES, system externally to the plasma chamber to absorb at least a portion of the electromagnetic radiation that has passed through the viewport and configured to measure signals in the near-field E- and B-field regions;
- measuring a first value based on the signal induced in the antenna wherein the signal is obtained from a plurality of powered RF electrodes configured to be independently modulated with one or more power sources; and
- calculating a second value indicative of a change of magnitude of the characteristic based on a change of magnitude of the first value, wherein the characteristic is plasma power and/or plasma pressure.

In one embodiment there is provided a method for measuring a characteristic of a plasma or a plasma chamber is provided, wherein the plasma chamber has a viewport, or similar feature, which is permeable to electromagnetic radiation such that at least a portion of the electromagnetic radiation emitted by the plasma in the plasma chamber passes through the viewport, the method comprising:

- providing the antenna of a Radio Emission Spectroscopy, RES, system externally to the plasma chamber to absorb at least a portion of the electromagnetic radiation that has passed through the viewport;
- measuring a first value based on the signal induced in the antenna; and
- calculating a second value indicative of a change of magnitude of the characteristic based on a change of magnitude of the first value, wherein the characteristic is one or more of plasma power, plasma pressure, plasma frequency, gas composition, and plasma chamber contamination or cleanliness.

The method preferably comprises determining which characteristic is associated with the second value based on the frequency spectrum of the signal induced in the antenna.

The plasma chamber is in one embodiment a single frequency driven plasma system.

In one embodiment, the characteristic is plasma pressure and calculating the second value comprises detecting a leak or a pressure variation in the plasma chamber.

In another embodiment, the plasma chamber is a multi-frequency driven plasma system. The characteristic is optionally plasma RES frequency and the method comprises calculating a third value indicative of reactance (capacitive, and/or inductive, and/or resistive) changes in the plasma chamber based on the second value.

Optionally, the method further comprises calibrating the RES system. Preferably, the step of calibrating comprises providing an antenna tuned to the fundamental frequency of the power supply system of the plasma chamber. More preferably, the step of providing an antenna comprises tuning the antenna to the fundamental frequency.

Preferably, the method further comprises controlling the plasma chamber based on the second value.

Further a system for measuring a characteristic of a plasma or a plasma chamber is provided, wherein the plasma chamber has a viewport, or similar feature, which is permeable to electromagnetic radiation such that at least a portion of the electromagnetic radiation emitted by the plasma in the plasma chamber passes through the viewport, the systems comprising:

- a Radio Emission Spectroscopy, RES, system provided externally to the plasma chamber to absorb at least a portion of the electromagnetic radiation that has passed through the viewport, the RES being configured to:

measure a first value based on the signal induced in the antenna; and calculate a second value indicative of a change of magnitude of the characteristic based on a change of magnitude of the first value, wherein the characteristic is one or more of plasma power, plasma pressure, plasma frequency, and plasma chamber contamination or cleanliness.

Preferably the RES is configured to determine which characteristic is associated with the second value based on the frequency spectrum of the signal induced in the antenna. It will be appreciated that the RES system can be combined with an OES system and configure to implement a single analysis process.

In another embodiment there is provided a system for measuring a characteristic of a plasma or a plasma chamber, wherein the plasma chamber has a viewport, or a surface, which is permeable to electromagnetic radiation such at least a portion of the electromagnetic radiation emitted by the plasma in the plasma chamber passes through the viewport, the system comprising:

a Radio Emission Spectroscopy, RES, system provided externally to the plasma chamber to absorb at least a portion of the electromagnetic radiation that has passed through the viewport, the RES being configured to:

measure signals in the near-field E- and B-field regions;

measure a first value based on the signal induced in the antenna wherein the signal is obtained from a plurality of powered RF electrodes configured to be independently modulated with one or more power sources; and calculate a second value indicative of a change of magnitude of the characteristic based on a change of magnitude of the first value, wherein the characteristic is plasma power and/or plasma pressure.

A computer-readable medium is also provided. The computer-readable medium comprises instructions which, when executed by a computer coupled to an antenna, cause the computer to:

measure a first value indicative when of at least a portion of electromagnetic radiation that has passed through a viewport of a plasma chamber, wherein the first value is based on the signal induced in the antenna; and calculate a second value indicative of a change of magnitude of the characteristic based on a change of magnitude of the first value, wherein the characteristic is one or more of plasma power, plasma pressure, plasma frequency, and plasma chamber contamination or cleanliness.

Preferably, the computer-readable medium further comprising instructions which, when executed by the computer, cause the computer to:

determine which characteristic is associated with the second value based on the frequency spectrum of the signal induced in the antenna.

BRIEF DESCRIPTION OF THE DRAWINGS

The invention will be more clearly understood from the following description of an embodiment thereof, given by way of example only, with reference to the accompanying drawings, in which: —

DETAILED DESCRIPTION OF THE DRAWINGS

In a RES system it is important ensure that the signals received by the sensor emanated from the plasma system (e.g. a plasma chamber) under test. Therefore, the sensors of the RES system (e.g. E-field and/or B-field antennae, or similar sensors) are often placed close to an access port on the plasma system under test. This access port typically consists of a glass/quartz/dielectric window which may, or may not, afford direct visible observation of the plasma. Regardless of direct visible access, RF emissions from the plasma can still pass through this access port. In addition to using off-the-shelf near field (NF), B-field, E-field, or similar antennae, a custom sensor can be built or manufactured. This can include the manual or automated deposition of dielectric and/or conducting components on a glass, dielectric, wood, or similar substrates, in order to custom build a sensor or antenna appropriate to the requirements of the RES system.

Figure 1:
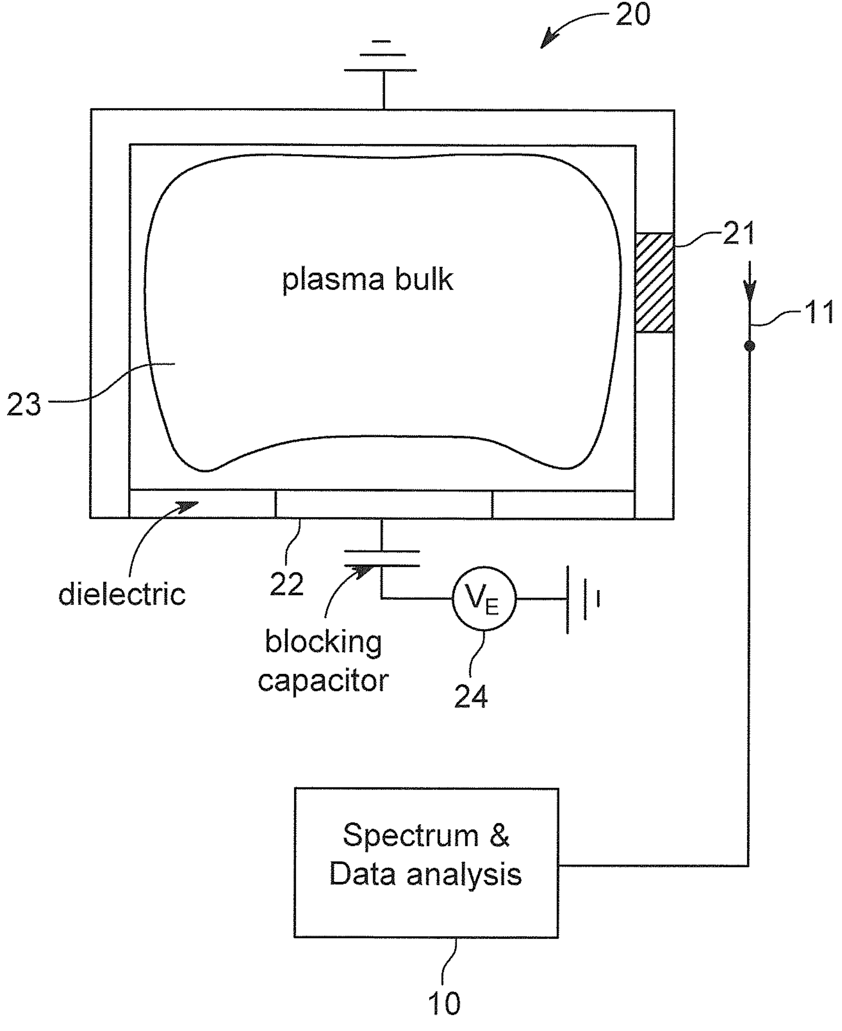
FIG. 1 shows a RES system and plasma chamber.

FIG. 1 show a RES system 10 in accordance with the present disclosure. The antenna 11 of the RES system 10 is provided proximate to the viewport 21 of a plasma chamber 20. Preferably, the plasma chamber is part of a low-pressure plasma system comprising a pressure-tight plasma chamber 20 and a vacuum system (not shown). In use, the plasma chamber of the low-pressure plasma system is substantially a vacuum. The plasma chamber 20 is provided with an electrode 22. The electrode 22 is powered by plasma generator 24. Preferably, the plasma generator is a high-frequency (i.e. 3 MHz-30 MHz) generator. In the embodiment shown in FIG. 1 the second electrode, the grounded electrode, comprises of the remainder of the enclosure wall of the chamber.

The RES system 10 can be used to monitor the state of a plasma 23, typically enclosed inside the plasma chamber. These measurements are non-invasive and non-contact with the plasma 23; they are also non-perturbative of the plasma 23. Thus, the state of the plasma 23 itself is measured without the insertion of metrology sensors or tools into the plasma chamber 20 itself. Thus, in all the specific illustrative examples described below, it is important to note that the sensing of the plasma parameters does not involve contact or invasive measures with respect to the plasma; the radio frequency sensor head/antenna(s) is/are remote from the plasma chamber providing for the measurement of the state of the plasma without any physical contact with the plasma itself.

Herein described a RES system 10 can be used to monitor key process parameters (e.g. power, pressure, etc.). The invention also describes how a RES system 10 can be used to monitor relevant processing challenges (e.g. wall cleanliness), thereby illustrating the technique's capability for real-time monitoring of industrial plasma-based manufacturing processes where multiple signals are generated in a chamber that are technically difficult to identify.

The antenna 11 is preferably a near field loop antenna. The antenna 11 is used to capture radio frequency (i.e. 3 kHz-30 GHz) emissions from the plasma in the vicinity of the chamber viewport 21. The current induced in the antenna 11 (herein referred to as the RES signal), when compared with a spatially averaged current measurement for an electronegative plasma, was found to correspond to conduction currents located predominately within the bulk of the plasma 23 (bulk plasma).

Two illustrative embodiments of a plasma chamber system are provided below in order to better illustrate the deployment of a RES monitoring system on commercially available plasma chambers. This is done to demonstrate the efficacy of the RES technique. It should be noted that the use of these specific commercial plasma chamber systems is non-limiting and that RES technique can be used with other suitable plasma chambers in other embodiments. Thus, the two examples given here are purely demonstrative.

(i) An Oxford Instruments PlasmaLab 100 capacitively coupled 13.56 MHz driven system. The chamber is typically pre-cleaned by running an oxygen/Ar plasma to clean the process chamber walls and to obtain a stable plasma. Radio frequency (RF) RES signals were collected using a near-field B-field loop antenna (diameter=21.6 mm), located at a distance of 1 mm from the plasma viewport, with the plane of the loop oriented perpendicular to the viewport of the plasma chamber. In the case of Oxford Instruments PlasmaLab 100 capacitively coupled reactor, the intercepted RES signal is found to consist of a primary emission at the driving frequency (13.56 MHz) plus numerous emissions at harmonics of the driving frequency.

(ii) A dual frequency source Lam EXELAN 2300 multiple frequency chamber, which consists of combination of driving frequencies at 2 MHz, 27 MHz and 162 MHz. The chamber is typically pre-cleaned by running an oxygen/Ar plasma to clean the process chamber walls and to obtain a stable plasma. The radio frequency (RF) RES signals were collected using a near-field B-field loop antenna (diameter=21.6 mm), located at a distance of 1 mm from the plasma viewport, with the plane of the loop oriented perpendicular to the viewport of the plasma chamber. By way of example, the captured RES spectrum was collected from an oxygen/Ar plasma which was operated using a combination of 162 MHz and 2 MHz frequencies with applied powers of 250 W and 50 W, respectively. In this demonstrative instance, the majority of the captured RES signal is found within a MHz frequency span of the main drive frequency at 162 MHz. Frequency mixing components of the 162 MHz signal with the lower 2 MHz frequency are easily captured, indicating that the plasma itself acts as a non-linear mixing medium for the RF excitation at two or more distinct frequencies.

Modern plasma-based manufacturing is moving towards plasma systems where multiple-powered electrodes, each driven at a different RF frequency, leads to much greater control over electron energy distribution functions, ion energies, and the densities of electrons and ions interacting with the materials being processed.

In a preferred embodiment of the invention the invention can be applied to a plasma system with multiple powered RF electrodes which can be independently modulated with dependent or independent power sources. In such a plasma system it is difficult to identify or discriminate between multiple signals that are captured by an antenna. The present invention demonstrates how a RES system can be used with respect to measuring the interaction of multiple and independently powered electrodes in the radio frequency domain and their use as a plasma parameter measurement tool.

Figures 8, 9:
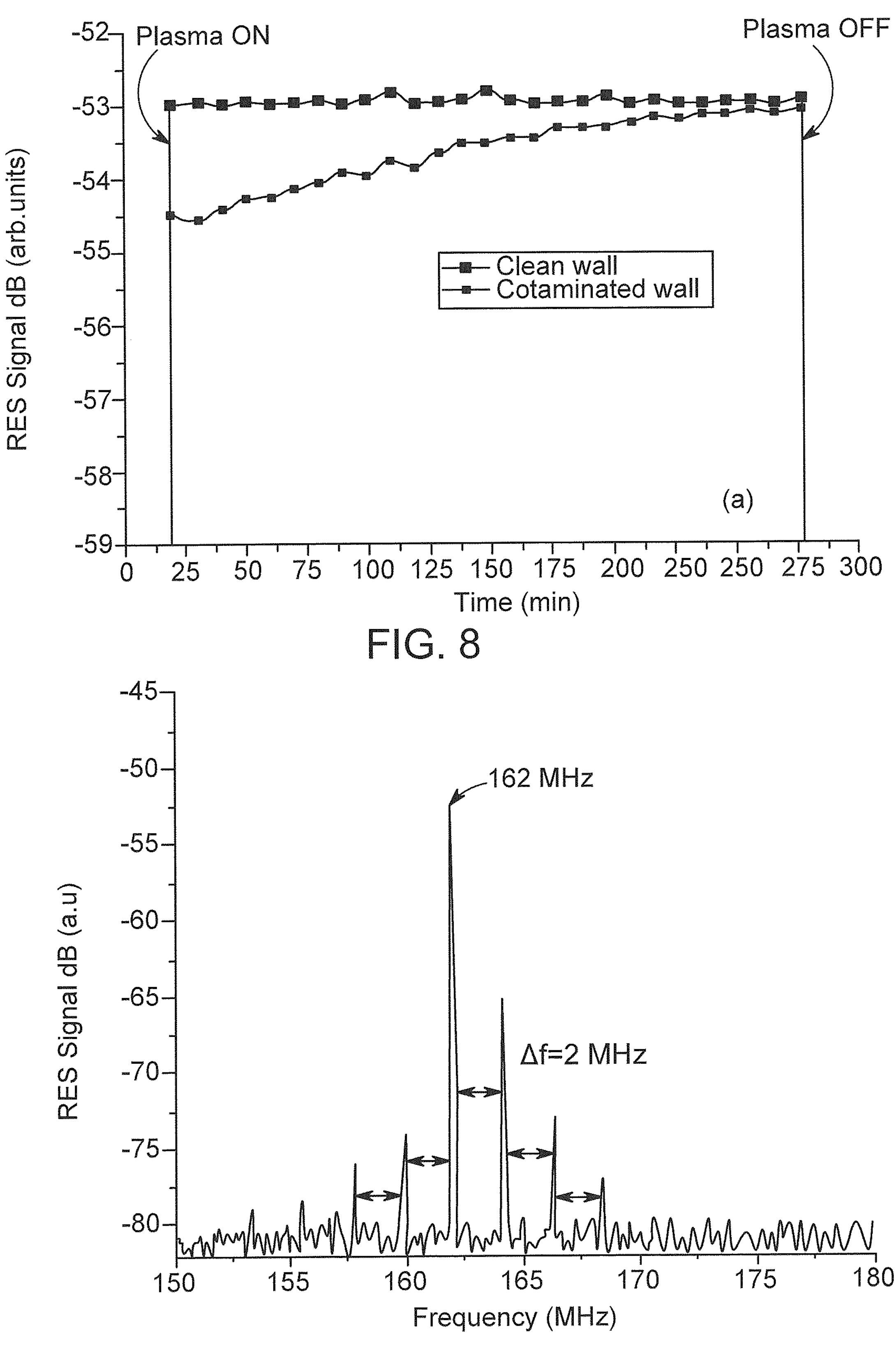
FIG. 8 shows the variation of captured RES signals as a function of the cleanliness of chamber wall e.g. of the Oxford Instruments PlasmaLab 100 tool.
FIG. 9 shows RES data collected from a multiple frequency plasma chamber—in this example a Lam EXELAN chamber which used a combination of 162 MHz and 2 MHz electrode drive frequencies.

Details of measurements acquired in this embodiment can be seen in FIG. 9 for a multiple frequency low-pressure RF plasma system (f1=2 MHz, f2=162 MHz) and intermixing products which suggests strongly that the plasma sheaths are the primary source of this non-linear diode mixing effect. The frequency heterodyning phenomenon is observable via the appearance of frequency sidebands appearing on both sides of the main drive frequency of 162 MHz. Beat frequencies with a regular frequency shift (Δf) of 2 MHz are clearly observed, indicating that the nonlinear plasma medium facilitates these effects. The appearance of multiple harmonics of the 162 MHz drive frequency, together with accompanying sidebands due to the lower (in this case 2 MHz) RF drive frequency (f1), leads to further RF heterodyne products in the 364 MHz range, 486 MHz range, 648 MHz range, etc. (n×162 Mhz, where n=1, 2, 3, 4, . . . , i.e. n×f2).

This data can be acquired in multiple configurations according to the invention. A single near field B-field loop antenna to capture both signals; a single B-field loop antenna to capture the lower frequency RF signals and their harmonics (in this case n×f1) together with a near field E-field antenna to capture harmonics and intermixing at the higher frequency and its harmonics (n×f2); other permutations of near-field E-field and B-field antennae are achieved. Suitably the system and method is configured to measure a first value based on the signal induced in the antenna wherein the signal is obtained from a number of powered RF electrodes configured to be independently modulated with one or more power sources. A second value is calculated indicative of a change of magnitude of the characteristic based on a change of magnitude of the first value, wherein the characteristic is plasma power and/or plasma pressure.

In another embodiment a plasma system can be provided where the RF power enters the plasma chamber via inductive coupling via powered RF coils surrounding the plasma chamber. It will be appreciated such embodiments can be incorporated in a pulsed capacitively coupled plasma (CCP) and/or inductively coupled plasma (ICP) systems.

Using these two plasma chamber systems an application of RES monitoring is now described.

1. Real-Time Monitoring of Power Variations in the Process Chamber Using RES

To demonstrate this technique, the Oxford Instruments PlasmaLab 100 etch tool was used with a 13.56 MHz capacitively driven electrode system. A near-field B-field loop antenna was connected to appropriate electronics to produce a spectral analysis of the captured signal.

It is known that the voltage induced in the loop antenna placed near the plasma chamber is proportional to the plasma currents within the bulk of the discharge and typically the fundamental drive frequency together with its first fundamental and first four or five further harmonics contains most, but not all, of the signal power with the vast majority of the induced signal present at the fundamental. For simplicity, the fundamental (i.e. 13.56 MHz) was monitored for current variations within the plasma. Signal capture is performed over a wide range of operating parameters to explore the responsiveness of this novel technique.

Figure 2:
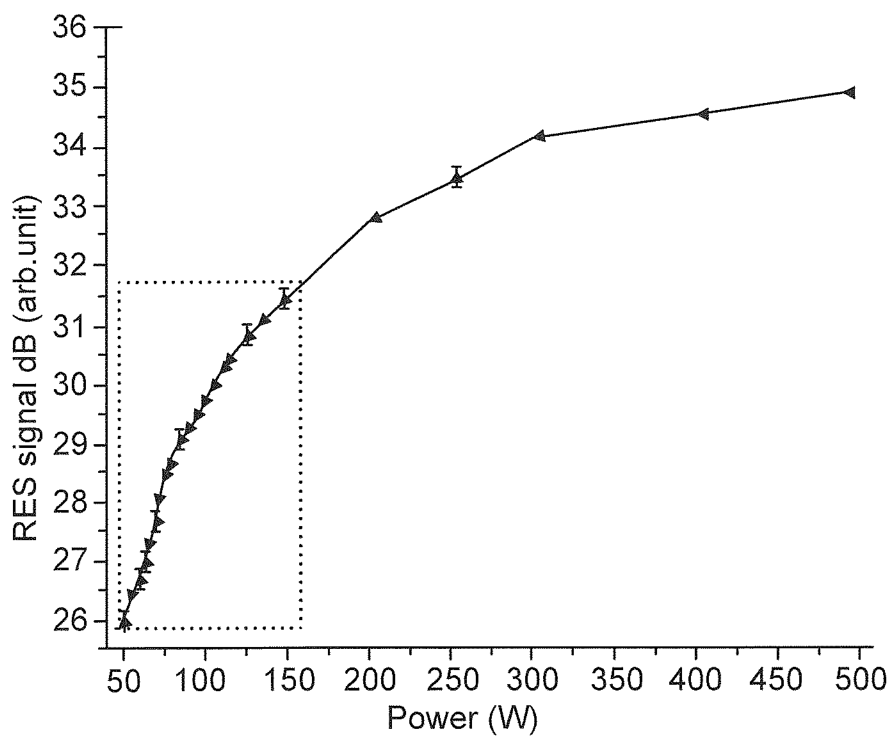
FIG. 2 shows the variation of a captured RES signal at the 13.56 MHz electrode drive frequency as a function of RF power for a wide power range from 50-500 W applied to the powered electrode of an Oxford Instruments PlasmaLab 100 etch tool.

FIG. 2 shows the variation of RES signal amplitude recorded by the near B-field loop at a distance of 1 mm from the plasma viewport as a function of the applied electrode RF power. The plasma chamber was operated by feeding oxygen gas at 50 sccm flow rate at a pressure of 100 mTorr. The RES signals at a fundamental frequency of 13.56 MHz were collected by varying electrode power from 50 W to 500 W. The variation in RES range is approximately 10 dB, which on a linear scale represents an order of magnitude change in signal amplitude.

Figure 3:
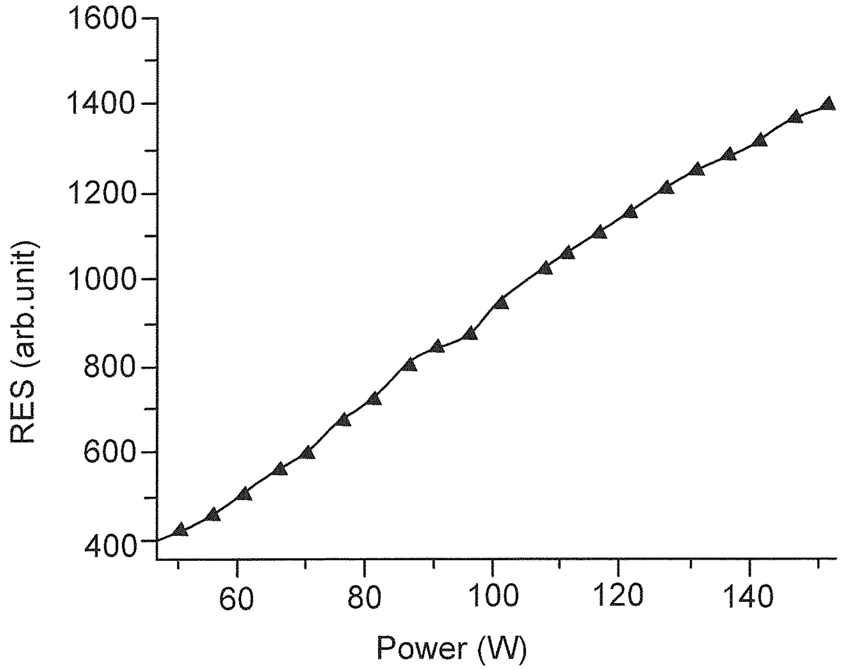
FIG. 3 is an enlarged view of the dashed portion of FIG. 2, and shows the variation of a captured RES signal at the fundamental (e.g. 13.56 MHz) electrode drive frequency as a function of RF power for from 50 150 W with RES readings expressed in linear scale.

The superlative sensitivity of the technique can be further confirmed by the observation that, within the 50-150 W power range, a power variation of 1 W corresponds to approximately a 3 fold variation in the RES signal. In particular, FIG. 3 shows an enlarged view of the dashed box in FIG. 2, showing the corresponding RES response in the linear scale for power variations from 50-150 W in 5 W steps. As is clear from this figure, RES is sensitive enough to detect a power change as low as 5 W with an error of <0.4%.

The data presented is the average of twenty scans and can be provided for sampling rates of tens of kilohertz. The number of scans and sampling rate can be adjusted or selected depending on the application required.

Figure 4:
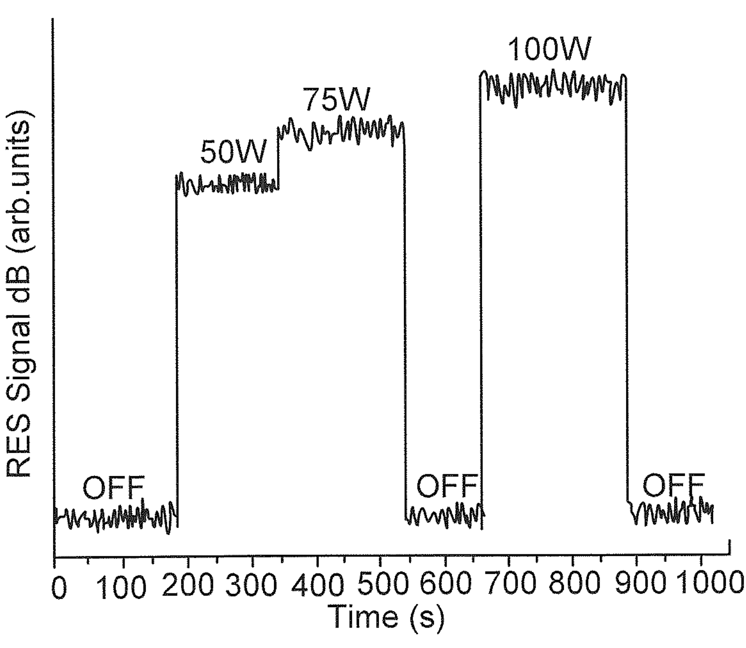
FIG. 4 shows real-time monitoring of a plasma process indicating step changes corresponding to the changes in the RF power during the processing.

FIG. 4 indicates real-time monitoring of a plasma process where the step changes indicate variation in the RF power. It is very clear that the contact-free RES technique is capable of monitoring RF power changes in real-time during the processing.

2. Real-Time Monitoring of Pressure Variations in the Process Chamber Using RES

In plasma processing systems, it is vitally important to determine the gaseous pressure inside the plasma process chamber. Any technique which can do so in a non-contact and non-invasive manner is of tremendous benefit, since it has the great advantage of being non-perturbative of (i.e. not disturbing) the plasma under test.

In the description below, it is shown that the RES technique is very useful for monitoring small pressure variations during typical semiconductor processing conditions. Again, for the sake of illustration, the description below references an Oxford Instruments PlasmaLab 100 tool using an oxygen plasma and operating at a frequency of 13.56 MHz although other suitable plasma chambers and plasma chamber configurations can be used. The plasma chamber is operated for 15 minutes at a power of 200 W and pressure of 100 mTorr before starting the RES measurements in order to make sure there is a stable plasma condition. The oxygen gas flow was kept constant at 50 sccm and RES data were collected by varying pressure from 10 mTorr to 250 mTorr.

Figure 5:
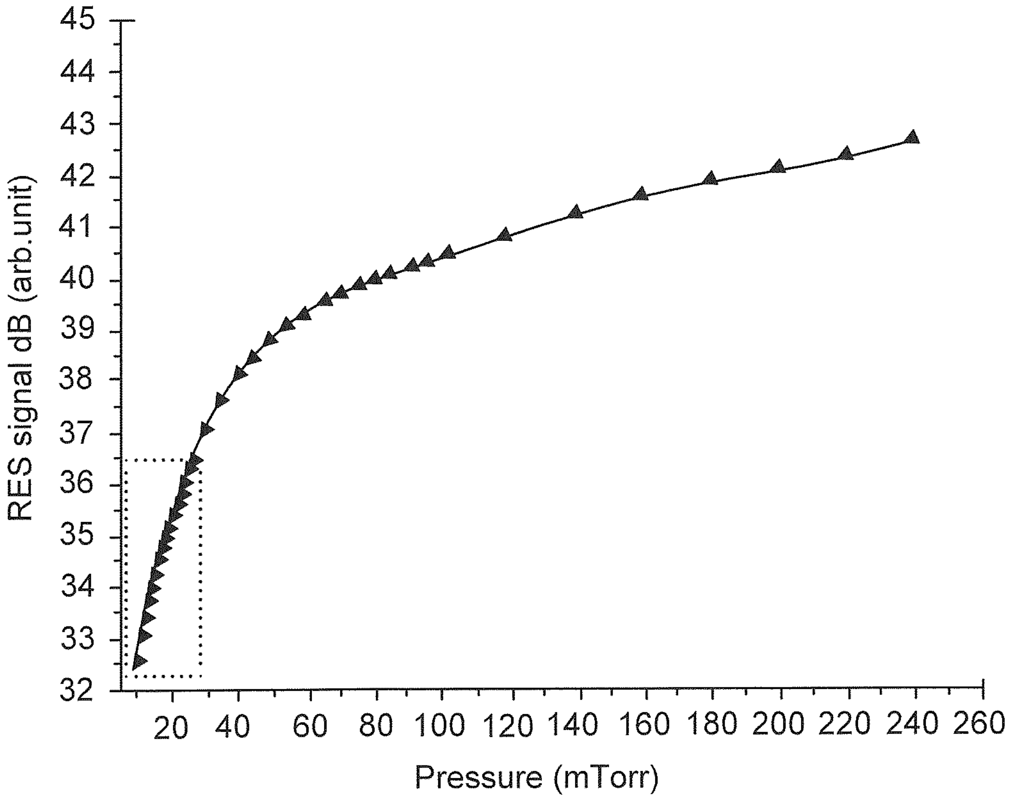
FIG. 5 shows the variation of a captured RES signals as a function of process pressure from 10 mTorr to 250 mTorr, illustrating the pressure dependence of RES signal at the fundamental frequency of the plasma chamber (e.g. 13.56 MHz)

FIG. 5 indicates the variation of the RES signal at the fundamental frequency (in this case 13.56 MHz) at an RF power of 400 W as a function of pressure from 10-250 mTorr.

Figure 6:
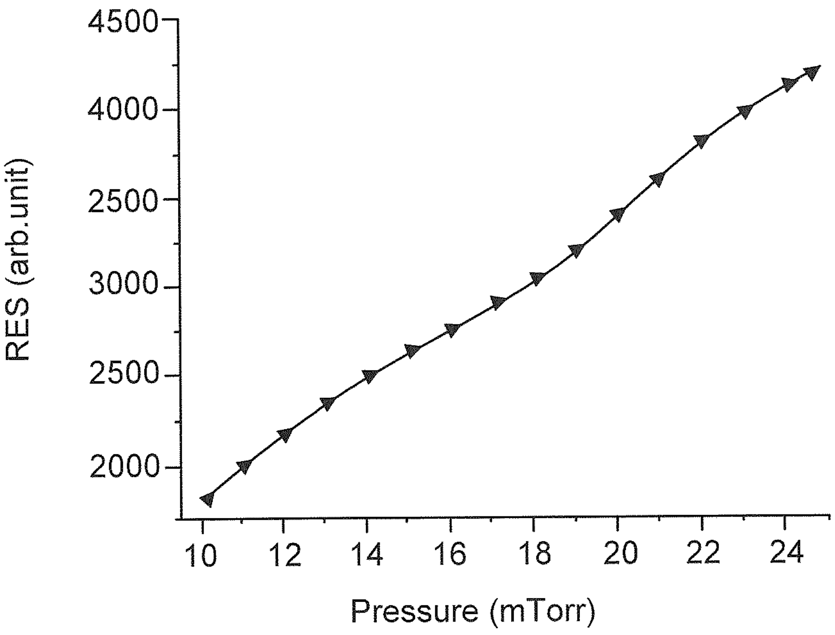
FIG. 6 is an enlarged view of the dashed portion of FIG. 5, and shows the variation of a captured RES signal at the fundamental (e.g. 13.56 MHz) as a function of process pressure from 10 mTorr to 25 mTorr on a linear scale.

FIG. 6 is an enlarged view of the dashed portion of FIG. 5, with RES signal represented in the linear scale. The sensitivity of the RES technique with respect to chamber pressure variations was verified by increasing the plasma chamber pressure in small steps of 1 mTorr up to 25 mTorr, as shown in FIG. 6, where the y axis is expressed in linear scale.

FIG. 6 shows RES signal amplitude varies as a function of pressure at 200 W RF power. In this example, the variation in RES amplitude range is approximately 10 dB, which on a linear scale represents order of magnitude change in signal intensity.

RES signal amplitude varies approximately 4 dB for pressure variations from 10-25 mTorr, which corresponds to approximately 2.4 in the linear scale. Thus, a RES probe is sensitive enough to detect a process pressure variation as low as 1 mTorr with an error of <0.1%.

Figure 7:
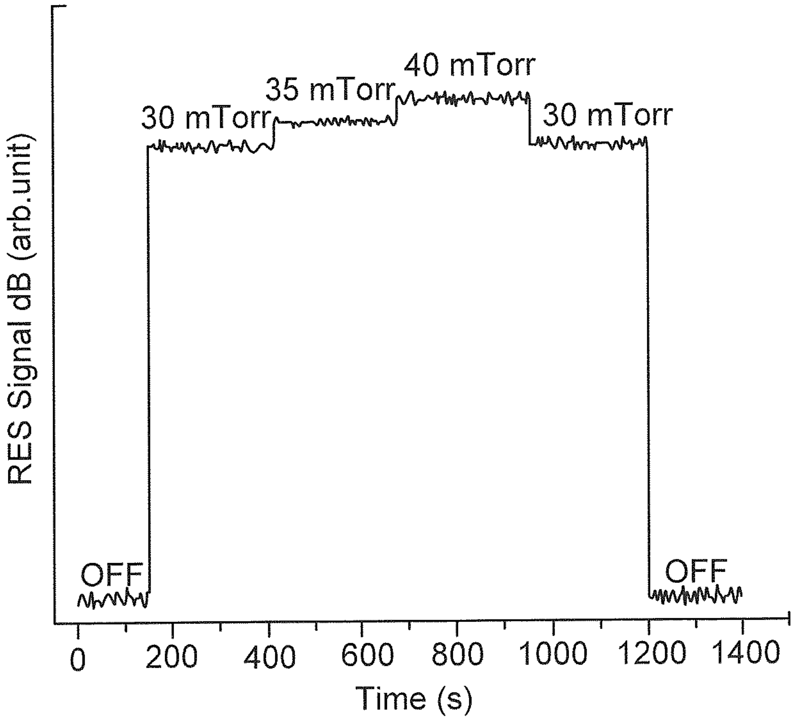
FIG. 7 shows real time process monitoring using the RES technique indicating pressure variations during the plasma process in the Oxford Instruments PlasmaLab 100 etch tool.

FIG. 7 indicates real-time monitoring of a plasma process with the step changes indicating variations in the plasma chamber pressure. From FIG. 7 it is very clear that the contact-free RES technique is capable of monitoring chamber pressure changes in real-time during the processing. This is applicable to both monitoring said pressure changes and for other applications. For example, the use of RES could have significant advantages when implemented as a leak detector for the plasma chamber.

3. Real-Time Monitoring of Chamber Wall Cleanliness Using RES

For plasma processes, the cleanliness (i.e. the amount of contaminates) of the plasma chamber's internal walls is a very important parameter. Contaminates significantly effect repeatability of process from wafer to wafer in integrated circuit manufacturing, for example. Thus, maintaining cleanliness remains one of the biggest challenges to process reproducibility during semiconductor etch processes.

By way of example, the chamber wall of an Oxford Instruments PlasmaLab 100 plasma system was deliberately contaminated with a photoresist product. The RES signals are then continuously measured before, during and after contamination. FIG. 8 illustrates the variation of RES signal amplitude at the fundamental frequency (i.e., in this example, 13.56 MHz). The RES amplitude was measured at continuous intervals at a rate of 133 kHz for an interval of 4.3 hours. As can be seen from FIG. 8, there is a clear and measurable difference between the amplitudes of the RES signals collected before, during and after the contamination of the plasma chamber wall with photoresist. The RES signal amplitude from the contaminated plasma chamber wall slowly approaches that of a clean plasma chamber wall as the contaminated wall becomes cleaner through the removal of contaminates (i.e., in this case, photoresist) by an oxygen plasma. Thus, RES can be utilised to monitor the chamber wall contamination.

4. Use of RES to Monitor Plasmas in a Multiple Frequency Chamber

Multiple frequency RF plasma configurations are attracting enormous interest due to their ability to independently control bulk and sheath properties in processing plasmas with advantages in tailoring ion energy and angular distributions, ion flux and sheath potentials impacting wafer surfaces. For examples as disclosed by Zhang Y, Zafar A, Coumou D J, Shannon S C and Kushner M J 2015 Control of ion energy distributions using phase shifting in multi-frequency capacitively coupled plasmas, J. Appl. Phys. 117 233302; and Chen W, Zhang X and Diao D 2018 Fast semi-analytical method for precise prediction of ion energy distribution functions and sheath electric field in multi-frequency capacitively coupled plasmas, Appl. Phys. Express 11, 056201; and Robiche J, Boyle P C, Turner M M and Ellingboe A R 2003 Analytical model of a dual frequency capacitive sheath J. Phys. D: Appl. Phys. 36 1810.

It is therefore very important to develop non-invasive probes to monitor and ultimately control plasma processes in these multiple frequency plasma chambers. As an example, RES measurements performed on a Lam EXELAN 2300 multiple frequency chamber, which consists of combination of driving frequencies at 2 MHz, 27 MHz and 162 MHz are set out below.

In FIG. 9, the frequency spectrum of the signal captured by the antenna of an RES system (which, as noted above is preferably a near field loop antenna) is shown. For brevity, this frequency spectrum is referred to as the captured RES spectrum. The captured RES spectrum is collected from an $Ar/O_2$ plasma which was operated using a combination of 162 MHz and 2 MHz frequencies with applied powers of 250 W and 50 W, respectively.

An example is shown of the captured RES signal found within a 30 MHz frequency span of the main drive frequency at 162 MHz. Frequency mixing components of the 162 MHz signal with the lower 2 MHz drive frequency are clearly seen via the frequency heterodyning phenomenon, which is observable via the appearance of frequency sidebands appearing on both sides of the main drive frequency of 162 MHz. Beat frequencies with a regular frequency shift ($\Delta f$) of 2 MHz are clearly observed, indicating that the non-linear plasma medium facilitates these effects.

5. Use of RES to Remotely Monitor Changes in Stray Capacitance, Chamber Conditions or Changes in the Sheath Characteristics of a Plasma By way of example we will show data captured on a Lam EXELAN 2300 multi-frequency tool, in this case using a combination of powered electrodes running at independent frequencies of 162 MHz and 27 MHz, respectively. The specific measurements shown below in FIG. 10 were carried out for an $Ar/O_2$ plasma at 25 mTorr pressure. The power of the 162 MHz drive electrode was kept constant at 250 W and that of the 27 MHz electrode was varied from 50 W to 250 W.

Figure 10A:
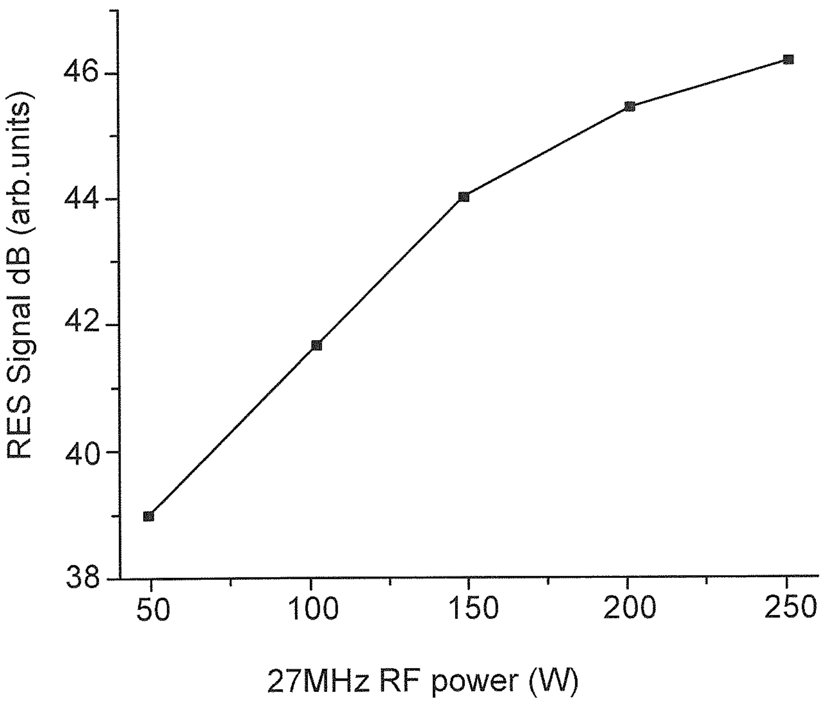
FIG. 10 shows RES data collected from a Lam EXELAN multi-frequency tool, which uses a combination of powered electrodes running at independent frequencies of 162 MHz and 27 MHz—FIG. 10(*a*) RES signal variation as a function of varying power on the 27 MHz RF generator while keeping that of 162 MHz electrode constant at 250 W, FIG. 10(*b*) variation of the RES signal frequency as a function of power to the 27 MHz RF electrode, and FIG. 10(*c*) shift of the RES signal frequency from the nominal 27.12 MHz applied electrode frequency as a function of power to that electrode.
Figure 10B:
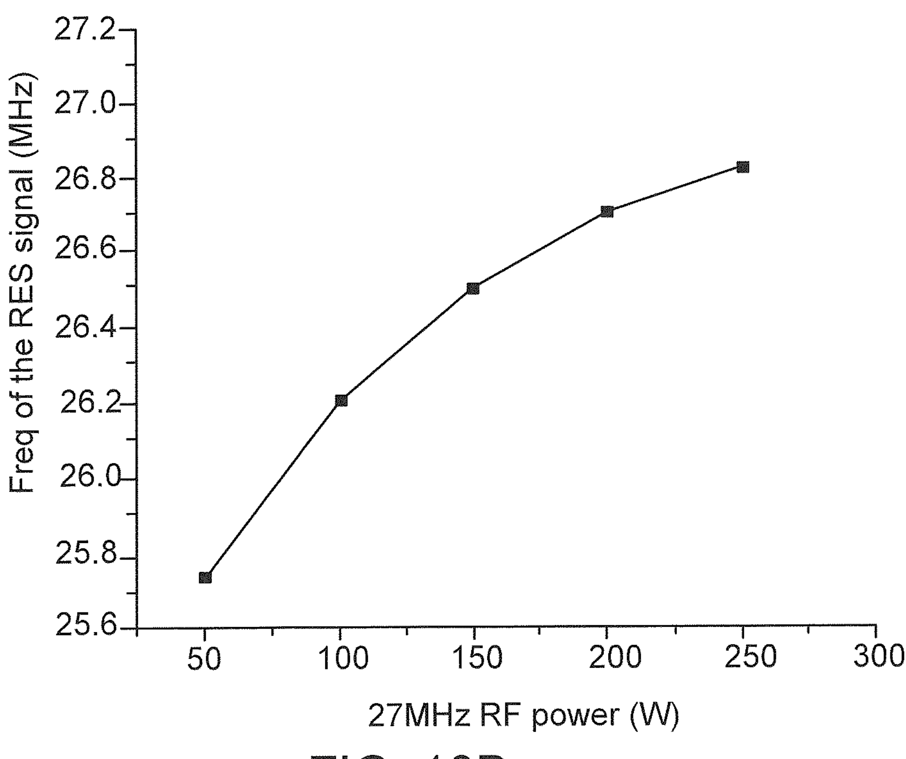
Figure 10C:
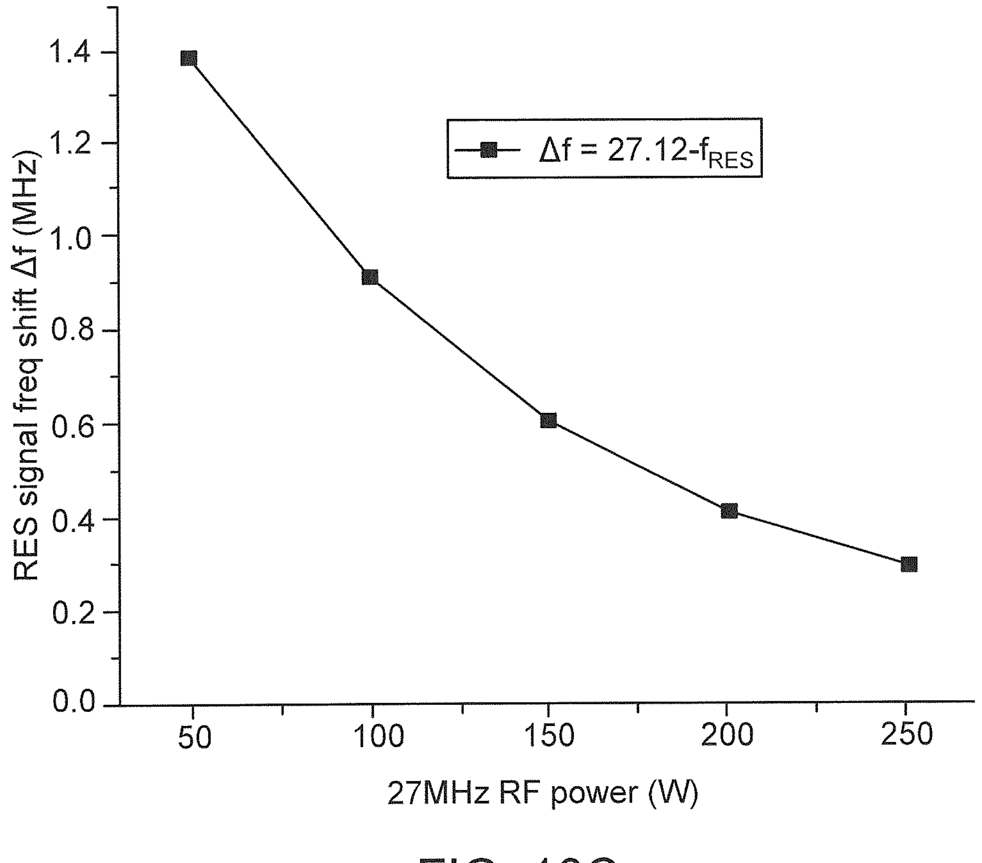

The figure (FIG. 10(*a*)) shows a trend (increasing) in the variation of peak RES amplitude with respect to power. This is in good agreement with results from the single frequency plasma chamber described above with reference to FIG. 2. In contrast to the single frequency case, however, a continuous change in the peak frequency of the RES signal captured near 27 MHz with increasing RF power is found (FIG. 10(*b*)). The shift in the emitted radio frequency ($\Delta f$) from the nominal 27.12 MHz peak is shown in FIG. 10(*c*).

This behaviour is believed to be a result of the frequency compensation characteristics of the autotuner coupling, where the impedance matching is carried out by a small adjustment of the lower (~27 MHz) operating frequency of the RF generator. The power amplifier autotunes with using a variable capacitor (C), which thereby introduces a compensating variable impedance, $Z_C=-j\,(1/\omega C)$, where $\omega$ is the radial frequency.

The bulk plasma behaves as an inductive resistive component with the sheath providing a capacitive effect, as disclosed by Lieberman M and Lichtenberg A 2005 Principles of Plasma Discharges and Materials Processing (Wiley, New York). Changes to the load capacitance as seen by the RF amplifier may be affected by adjusting the impressed frequency and thus minimizing the return power. With increasing power, the amplifier compensates by decreasing the frequency and increasing the output impedance $Z_{out}$ of the amplifier to match the load. The observed frequency shift is therefore a proxy for capacitive changes in the chamber and can be used to remotely monitor shifts in the load capacitance due to changes in stray capacitance, chamber conditions or changes in the sheath characteristics.

It should be noted that the choice of this specific plasma chamber for each of the above examples and their specific configurations are merely for the sake of example. Various plasma chambers, each operating at specific frequencies, powers, pressures, and combinations of other plasma parameters may of course be used with the RES. However, it should also be noted that these examples illustrate the more general point—namely the suitability of RES and RES systems for the measurement and/or control of characteristics and operating conditions of a plasma in a plasma chamber without the need for need for the insertion of a probe into the plasma chamber.

Furthermore, RES provides a more resilient means for plasma measurement and control than OES. RES is insensitive to signal degradation from opaque nonconductive coatings present on a chamber viewport and thus offers a distinct advantage over widely employed optical monitoring techniques, which rely on transparent viewport access to the discharge. From the above description of RES for equipment parameters including e.g. applied RF power, chamber pressure, RF bias frequencies and chamber wall cleanliness, the present invention allows for these characteristics of a plasma or a plasma chamber to be reliably measured accurately. In particular, it will be appreciated that the induced RES signal was found to vary sensitively to pressure changes, and RES systems were shown to be able to detect pressure variations as low as ~1 mTorr in the above examples of generic plasma processes. As such RES can be used to capture real-time measurements in scenarios relevant to contemporary challenges faced during semiconductor fabrication (i.e., window coating and wall disturbance).

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A method for measuring a characteristic of a plasma within a plasma chamber, wherein the plasma chamber is a multi-frequency driven plasma system, and wherein the plasma chamber has a viewport or a surface which is permeable to electromagnetic radiation such at least a portion of the electromagnetic radiation emitted by the plasma in the plasma chamber passes through the viewport, the method comprising:

providing an antenna of a Radio Emission Spectroscopy, RES, system externally to the plasma chamber to absorb at least a portion of the electromagnetic radiation that has passed through the viewport and configured to measure signals in near-field E- and B-field regions;

measuring a first value based on the signal measured by the antenna wherein the signal measured by the antenna is obtained from a plurality of powered RF electrodes configured to be independently modulated with a plurality of power sources, wherein at least two of the plurality of power sources operate at different RF frequencies simultaneously; and calculating a second value indicative of a change of magnitude of the characteristic based on a change of magnitude of the first value, wherein the characteristic is plasma power and/or plasma pressure.

2. The method of claim 1, comprising determining which characteristic is associated with the second value based on the frequency spectrum of the signal measured by the antenna.

3. The method of claim 1, wherein the characteristic is plasma pressure and calculating the second value comprises detecting a leak or a pressure variation in the plasma chamber.

4. The method of claim 1 wherein the plasma chamber is a capacitively coupled plasma system.

5. The method of claim 1, wherein the characteristic is the measured RES frequency signals and the methods comprise calculating a third value indicative of reactance changes in the plasma chamber based on the second value wherein the reactance change results from at least one of capacitive changes of a plasma sheath, inductive or resistive changes of a bulk plasma.

6. The method of claim 1 comprising the step of enabling a RF power supplied to the RF electrodes to enter the plasma chamber via inductive coupling via powered RF coils surrounding the plasma chamber.

7. The method of claim 1, wherein the method further comprises:

calibrating the RES system.

8. The method of claim 7, wherein the step of calibrating comprises providing an antenna tuned to the fundamental frequency of the power sources of the plasma chamber.

9. The method of claim 8, wherein the step of providing an antenna comprises tuning the antenna to the fundamental frequency or captured sub-harmonics of the fundamental frequency.

10. The method of claim 1 wherein the method further comprises controlling the plasma chamber based on the second value.

11. The method of claim 1, wherein the signal measured by the antenna represents a composite near-field electromagnetic radiation emitted by the plasma due to the interaction of the at least two different RF frequencies with the plasma.

12. The method of claim 1, wherein the signal measured by the antenna represents frequency mixing of the components of the at least two different RF frequencies with the plasma.

13. The method of claim 12, wherein the frequency mixing comprises frequency side bands and/or beat frequencies.

14. A system for measuring a characteristic of a plasma within a plasma chamber, wherein the plasma chamber is a multi-frequency driven plasma system, and wherein the plasma chamber has a viewport, or a surface, which is permeable to electromagnetic radiation such at least a portion of the electromagnetic radiation emitted by the plasma in the plasma chamber passes through the viewport, the system comprising:

a Radio Emission Spectroscopy, RES, system provided externally to the plasma chamber to absorb at least a portion of the electromagnetic radiation that has passed through the viewport, the RES being configured to:

measure signals in near-field E- and B-field regions;

measure a first value based on the signal measured by an antenna of the RES wherein the signal measured by the antenna is obtained from a plurality of powered RF electrodes configured to be independently modulated with a plurality of power sources, wherein at least two of the plurality of power sources operate at different RF frequencies simultaneously; and calculate a second value indicative of a change of magnitude of the characteristic based on a change of magnitude of the first value, wherein the characteristic is plasma power and/or plasma pressure.

15. The system of claim 14, wherein the RES is configured to determine which characteristic is associated with the second value based on the frequency spectrum of the signal measured by the antenna.

16. The system of claim 14 wherein the system is incorporated in a pulsed CCP or ICP systems.

17. A computer-readable medium comprising instructions which, when executed by a computer coupled to an antenna, cause the computer to:

measure a first value indicative of electromagnetic radiation that has passed through a viewport, or a surface, of a plasma chamber, wherein the plasma chamber is a multi-frequency driven plasma system, and wherein the first value is based on a signal measured by the antenna wherein the signal measured by the antenna is obtained from a plurality of powered RF electrodes configured to be independently modulated with a plurality of power sources, wherein at least two of the plurality of power sources operate at different RF frequencies simultaneously; and calculate a second value indicative of a change of magnitude of the characteristic based on a change of magnitude of the first value, wherein the characteristic is plasma power and/or plasma pressure.

18. The computer-readable medium of claim 17 further comprising instructions which, when executed by the computer, cause the computer to:

determine which characteristic is associated with the second value based on the frequency spectrum of the signal measured by the antenna.

* * * * *